United States Patent
Van Veen et al.

(10) Patent No.: US 6,890,797 B2
(45) Date of Patent: May 10, 2005

(54) METHOD OF MAKING A SURFACE MOUNTABLE SEMICONDUCTOR DEVICE USING A FLEXIBLE FOIL AND A SEMICONDUCTOR DEVICE OBTAINED BY MEANS OF SAID METHOD

(75) Inventors: Nicolaas Johannes Anthonius Van Veen, Eindhoven (NL); Marc Andre De Samber, Eindhoven (NL); Thomas Weiss, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 210 days.

(21) Appl. No.: 10/067,425

(22) Filed: Feb. 4, 2002

(65) Prior Publication Data

US 2002/0119594 A1 Aug. 29, 2002

(30) Foreign Application Priority Data

Feb. 9, 2001 (EP) ............................................. 01200496

(51) Int. Cl.$^7$ ............................................. H01L 21/50
(52) U.S. Cl. ...................................... 438/118; 438/125
(58) Field of Search ............................. 438/106, 107, 438/108, 110, 113, 118, 125, 464

(56) References Cited

U.S. PATENT DOCUMENTS

| | | | |
|---|---|---|---|
| 4,246,595 A | 1/1981 | Noyori et al. | 357/70 |
| 5,615,476 A | 4/1997 | Böttge et al. | 29/832 |
| 5,620,928 A | 4/1997 | Lee et al. | 438/118 |
| 5,840,417 A | 11/1998 | Bolger | 428/323 |
| 6,166,433 A | 12/2000 | Takashima et al. | 257/702 |
| 6,225,206 B1 * | 5/2001 | Jimarez et al. | 438/616 |
| 6,235,552 B1 * | 5/2001 | Kwon et al. | 438/106 |
| 6,492,737 B1 * | 12/2002 | Imasu et al. | 257/778 |

FOREIGN PATENT DOCUMENTS

EP          0260490 A1    8/1987    ........... H01L/23/48

* cited by examiner

Primary Examiner—Evan Pert
Assistant Examiner—Scott B. Geyer

(57) ABSTRACT

The invention relates to the manufacture of a semiconductor device (10) which is suitable for surface mounting of a semiconductor body (1) provided with connection regions (2) for, for example, a diode.

Figure 1:
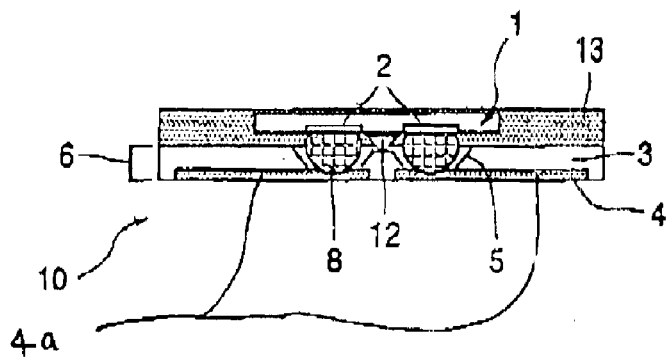

In a method, a flexible foil (6) comprises a conductor pattern (4) and an insulating layer (3), and is detachably secured, on the side of the conductor pattern (4), to a substrate (7).

9 Claims, 2 Drawing Sheets

METHOD OF MAKING A SURFACE MOUNTABLE SEMICONDUCTOR DEVICE USING A FLEXIBLE FOIL AND A SEMICONDUCTOR DEVICE OBTAINED BY MEANS OF SAID METHOD

The invention relates to a method of manufacturing a semiconductor device which is suitable for surface mounting and which includes a semiconductor body comprising an active element provided with connection regions situated at the surface of the semiconductor body, an electrically insulating medium being provided, on one of its sides, with a conductor pattern which is suitable for surface mounting, and, on the other side, with the semiconductor body, the connection regions of the active element being connected to the conductor pattern by means of electrically conductive vias in the insulating medium.

Such a device comprises, for example, a diode or transistor as the active element, and can suitably be used for many applications. Surface mounting is attractive, in particular, because the amount of surface area that is taken up when use is made of this technique is small.

Such a method is disclosed in United States patent specification U.S. Pat. No. 5,776,798, published on Jul. 7, 1998. In said document a description is given of a method wherein a semiconductor body is electroconductively secured, by means of the connection regions of an active element, onto a conductor pattern that is situated on a side of, for example, a printed circuit board. The other side of said printed circuit board is also provided with a conductor pattern which is connected to the other conductor pattern by means of electroconductive vias in the printed circuit board. After securing the semiconductor body onto the printed circuit board, said semiconductor body is provided with a synthetic resin envelope, and an individual device is obtained, for example, by sawing through the envelope and the printed circuit board.

A drawback of such a method resides in that a device obtained by means of said method still takes up comparatively much space. In addition, the method is comparatively laborious and hence expensive.

Therefore, it is an object of the invention to provide a method by means of which very compact devices can be obtained and which, in addition, is simple and inexpensive.

This object is achieved in accordance with the invention by a method of the type mentioned in the opening paragraph, which is characterized in that the electrically insulating medium provided with the conductor pattern is formed by a flexible foil comprising a conductive layer and an electrically insulating layer, which flexible foil is detachably secured to a substrate on the side of the conductor pattern formed in the conductive layer. The invention is based first and foremost on the recognition that a flexible foil is capable of further reducing the dimension of the device, in particular in the thickness direction. In addition, said flexible foil can very suitably be used to simplify the manufacture, particularly because only a single conductive layer and a single conductor pattern are necessary for the manufacture. The electrically conductive vias can be readily formed by providing the insulating layer with apertures and by rendering these apertures electrically conductive and, at the same time, securing the semiconductor body onto the conductor pattern in an electrically conductive manner. This is facilitated by the small thickness of the flexible foil, which implies that also the insulating layer has a small thickness. By detachably securing the flexible foil to a substrate, the disadvantages associated with the use of a flexible foil are avoided and a large number of semiconductor devices can be simultaneously manufactured in a very accurate and reliable manner. After the device has been finished, this substrate can be removed.

Thus, in a preferred embodiment of a method in accordance with the invention, the electrically conductive vias are formed by providing the insulating layer with apertures, as a result of which parts of the conductor pattern in the conductive layer are exposed, and introducing solder into said apertures, as a result of which the connection conductors of the semiconductor body are electrically connected to the conductor pattern. The solder is preferably provided by means of a printing technique which is inexpensive as well as compatible with the use of a (thin) flexible foil.

Preferably, prior to the formation of the electrically conductive vias and prior to the provision of the semiconductor body on the flexible foil that is detachably secured to the substrate, the flexible foil is detachably secured, on the side of the insulating layer, to another substrate, after which the conductor pattern is formed in the conductive layer, whereafter the flexible foil is detachably secured, on the side of the conductive layer, to the substrate, after which the other substrate is removed.

In a favorable embodiment, a number of semiconductor bodies are simultaneously formed so as to be connected to each other, and subsequently secured, on a side opposite the connection regions, to an elastic foil, after which they are separated by means of sawing or etching, whereafter the elastic foil is stretched uniformly in all directions after which the individual semiconductor bodies are provided and secured onto the flexible foil. In this manner, the entire manufacturing process can be carried out on the scale of a so-termed wafer. As a result, this manufacturing process is easy, straightforward and inexpensive.

Preferably, prior to the provision of the semiconductor body on the flexible foil, a part thereof that is situated between the apertures in the insulating layer is provided with an electrically insulating fixing agent on which the semiconductor body is placed and the height of which determines the distance between the semiconductor body and the flexible foil. This has, inter alia, the important advantage that minimum stress is imparted on the conductive vias and the underlying part of the foil, as a result of which the reliability of the device is increased. In this manner, regulating and checking the electrical insulation by means of a synthetic resin envelope between the semiconductor body and the foil can be improved too.

Preferably, after the provision of the semiconductor body on the flexible foil, a liquid, electrically insulating synthetic resin is provided between the semiconductor body and the flexible foil as well as around the semiconductor body, which synthetic resin is subsequently cured, after which the substrate is removed. Also this step can be carried out on "wafer scale". Use can also advantageously be made of the elastic foil discussed hereinabove. After the electrically conductive vias have been formed, for example by soldering, and after curing the enveloping synthetic resin, individual semiconductor devices can be obtained by means of sawing in two mutually perpendicular directions.

In another modification, a solid photoresist layer is used as the electrically insulating layer. This solid photoresist layer can be readily attached to a (different) substrate, and, consequently, the apertures necessary to form the vias can be readily formed in said solid photoresist layer. A suitable material for the insulating layer is a polyimide. The conductive layer is preferably made of copper and can be readily provided with the desired conductor pattern by means of photolithography and etching. The insulating layer preferably comprises a polyimide and can be provided with apertures in a similar way.

The invention further comprises a semiconductor device which is suitable for final assembly using the surface mounting technique, and which is obtained by means of a method in accordance with the invention.

These and other aspects of the invention will be apparent from and elucidated with reference to the embodiment(s) described hereinafter.

Figure 3A:
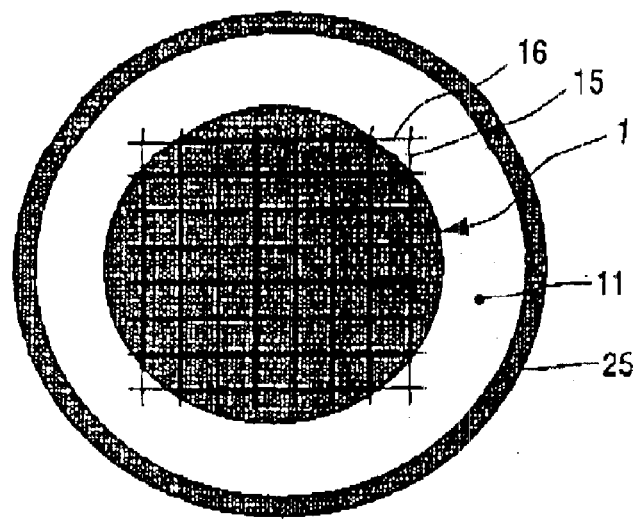
Figure 3B:
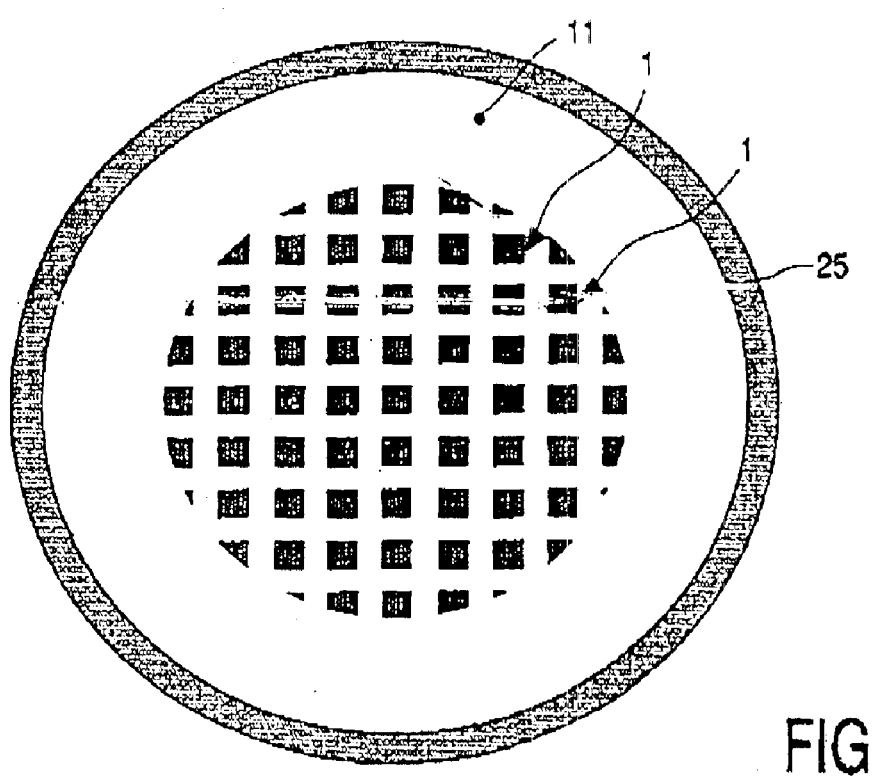
Figure 2A:
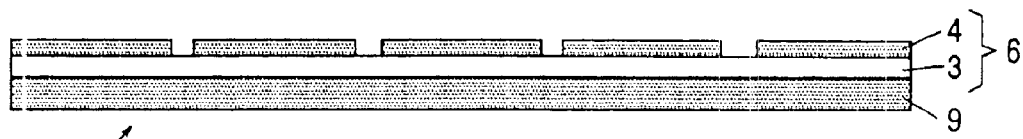
Figure 2B:
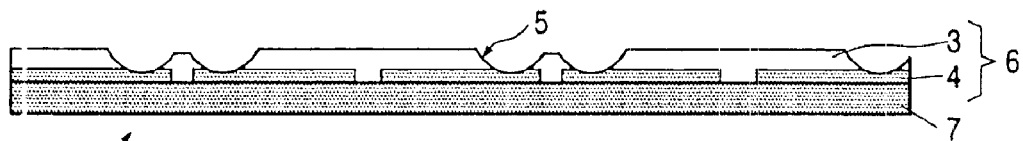
Figure 2C:
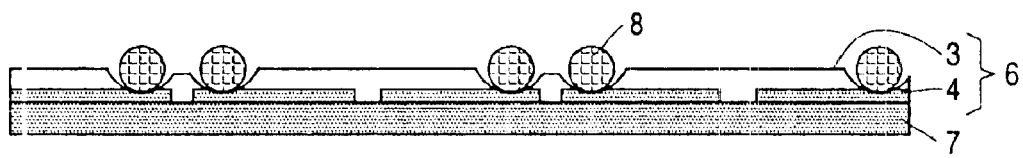
Figure 2D:
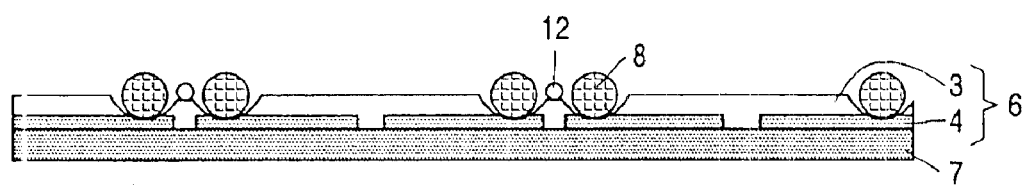
Figure 2E:
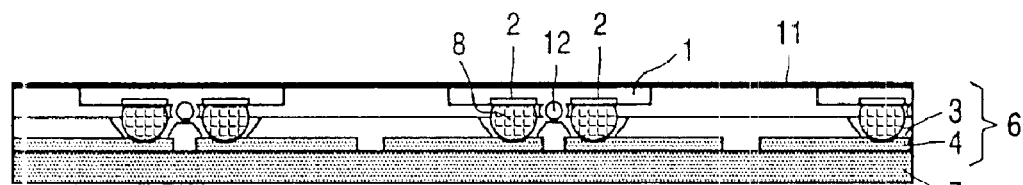
Figure 2F:
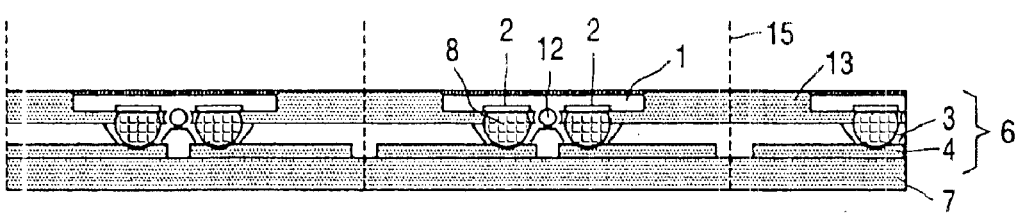

In the drawings:

FIG. 1 is a diagrammatic, cross-sectional view, at right angles to the thickness direction, of a semiconductor device with a diode manufactured by means of a method in accordance with the invention, FIGS. 2A through 2F are diagrammatic, cross-sectional views, at right angles to the thickness direction, of the semiconductor device of FIG. 1 in successive stages of the manufacturing process using an embodiment of a method in accordance with the invention, and FIGS. 3A and 3B are diagrammatic, plan views of the manufacture of a part used, according to the method of FIG. 2, in FIG. 2E.

The Figures are not drawn to scale and, for clarity, particularly the dimensions in the thickness direction are exaggerated. Wherever possible, corresponding areas bear the same reference numeral.

FIG. 1 is a diagrammatic, cross-sectional view, at right angles to the thickness direction, of a semiconductor device with a diode, which is manufactured by means of a method in accordance with the invention. The device 10 comprises a semiconductor body 1 with an active element, in this case a diode, which is provided with connection regions 2 situated at the surface of the semiconductor body 1. By means of solder 8, these connection regions are electroconductively connected to a conductor pattern 4, which in this case comprises two connection conductors 4a, and which is formed in a conductive layer, in this case of copper, which forms part of a (flexible) foil 6 which, apart from the conductive layer, comprises an electrically insulating layer 3 wherein conductive vias 5 are formed at the location of the soldered joint 8. Between the semiconductor body 1 and the foil 6, fixing agents are provided on the insulating layer 3, which support the semiconductor body 1 and unburden the soldered joints 8. Between the semiconductor body 1 and the foil 6, a synthetic resin envelope 13, in this case of an epoxy material 13, is situated (around the fixing means 12 and the soldered joints 8), which synthetic resin envelope is also situated around the semiconductor body 1. A method of manufacturing, which will be described hereinafter, enables this device 10 to be very compact, particularly in the thickness direction, and to be readily manufacturable at low cost. The device 10 of this example is manufactured as follows, using an embodiment of a method in accordance with the invention.

FIGS. 2A through 2F are diagrammatic, cross-sectional views, at right angles to the thickness direction, of the semiconductor device of FIG. 1 in successive stages of the manufacture, using an embodiment of a method in accordance with the invention. FIGS. 3A and 3B are diagrammatic, plan views of the manufacture of a part used, in the method of FIG. 2, in FIG. 2E. Use is made (see FIG. 2A) of a flexible foil 6 which comprises an electrically insulating layer 3, in this case a polyimide layer having a thickness of 50 $\mu$m, and a conductive layer, in this case a copper layer having a thickness of 17 $\mu$m. On the side of the insulating layer 3, the foil 6 is detachably secured to a substrate 9, in this case of glass having a thickness of 5 mm, by means of a thermoplastic or UV-soluble adhesive. By means of photolithography and etching with an etchant that is suitable for copper, the conductive 4 is subsequently converted to a conductor pattern 4 that is suitable for a diode.

Subsequently, (see FIG. 2B) on the side of the conductor pattern 4, the foil 6 is also detachably secured to a second substrate 7, in this case also made of glass having a thickness of 5 mm, by means of an adhesive similar to the one described hereinabove, after which the first substrate 9 is removed. The insulating layer 3, which in this case of polyimide, is subsequently provided with conductive vias 5 exposing the conductor pattern 4 by means of photolithography and etching using a customary etchant. Subsequently, (see FIG. 2C) solder 8 is provided in these conductive vias 5, said solder comprising in this case a Sn—Ag—Cu—Sb solder 8. Preferably, as in this example, use is made of a so-termed printing technique. This technique is simple and very suitable for mass production.

Subsequently, (see FIG. 2D) a fixing agent 12, in this case a liquid, yet viscous epoxy material 12, is provided between the solder regions 8 on the insulating layer 3. For this purpose use is made of a so-termed dispensing technique. The epoxy material can be cured at 200° C. for ½ to 1 minute.

Next, (see FIG. 2E), an elastic foil 11, in this case of rubber, is provided above the substrate 7. Semiconductor bodies 1 are detachably secured to the lower side of the elastic foil 11 in such a way that the side of the semiconductor bodies that is provided with connection regions 2 faces the substrate 7, and the distance between the semiconductor bodies corresponds to the distance between each pair of solder regions 8. The foil 11 is arranged at such a small distance from the substrate 7 that each semiconductor body 1 rests on a fixing agent 12 and contacts the solder regions 8 at the location of the connection regions 2. By means of a suitable heat treatment, in this case at 250° C. for a ½ minute, the semiconductor body 1 is subsequently soldered to the conductor pattern 4. In this example, the fixing agent 12 is also cured in this step.

Subsequently, (see FIG. 2F) a liquid epoxy material 13, which forms a customary enveloping material, is provided around the semiconductor bodies 1 and between each semiconductor body 1 and the foil 6, a synthetic resin envelope 13 being formed from said epoxy material after curing by means of, for example, a customary thermal treatment. Next, the foil 11 is removed. Subsequently, individual devices 10 are obtained by sawing in two mutually perpendicular directions 15, 16, only direction 15 being shown in FIG. 2E, which individual devices are suitable for surface mounting, after removal of the substrate 7, and are very compact and inexpensive by virtue of the method in accordance with the invention. It is to be noted that the conductor pattern 4 is interrupted at the location of the saw cuts 15, 16, as is clearly shown in FIG. 2. By virtue thereof, the sawing process to form individual semiconductor devices 10 is facilitated.

Further details regarding the manufacture of the foil 11 provided with semiconductor bodies 1, as shown in FIG. 2E, are shown in FIG. 3A and FIG. 3B. They show (see FIG. 3A), how a large number of semiconductor bodies 1 are manufactured within a "wafer" 1. Said wafer 1 is subsequently detachably secured onto an elastic foil 11 that is situated within a ring 25 whose diameter can be enlarged. By means of, for example, sawing in two mutually perpendicular directions 15, 16, the wafer 1 is divided into individual semiconductor bodies 1. Subsequently, (see FIG. 3B) the foil is uniformly stretched in all directions by enlarging the diameter of the ring 25, as a result of which the spacing between the semiconductor bodies is increased. This spacing is chosen to be equal to the mutual distance between each pair of solder regions 8 on the foil 6 in FIG. 2E.

The invention is not limited to the example given herein, and within the scope of the invention many modifications and variations are possible to those skilled in the art. For example, thicknesses and materials may be used which are different from those employed in the example. The invention is particularly suitable for the manufacture of (semi-)discrete semiconductor devices, such as diodes and transistors, but it may also advantageously be used, under certain conditions, to manufacture (more or less) integrated circuits.

It is emphasized that the different process steps do not necessarily have to be carried out at one location or in one factory. For example, particularly the first steps wherein the conductor pattern is formed in the conductive layer and the openings are formed in the insulating layer can be carried out at a different location. Also regarding the sequence or exact time of different steps, many variations are possible. For example, the foil 11 can also be removed before the synthetic resin envelope 13 is provided and formed.

What is claimed is:

1. A method of manufacturing a semiconductor device which is suitable for surface mounting and which includes a semiconductor body comprising an active element provided with connection regions situated at the surface of the semiconductor body, an electrically insulating layer being provided, on one of its sides, with a conductor pattern which is suitable for surface mounting, and, on the other side, with the semiconductor body, the connection regions of the active element being connected to the conductor pattern by means of electrically conductive vias in the insulating layer, the method including the steps of:

forming the conductor pattern and the insulating layer using a flexible foil, wherein the flexible foil originally comprises a conductive layer and an electrically insulating layer, and wherein the conductor pattern is formed from the conductive layer of the flexible foil and the insulating layer is formed from the electrically insulating layer of the flexible foil; and detachably securing the flexible foil to a substrate on the side of the conductor pattern.

2. A method as claimed in claim 1, wherein the electrically conductive vias are formed by providing the insulating layer with apertures, as a result of which parts of the conductor pattern in the conductive layer are exposed, and introducing solder into said apertures, as a result of which the connection regions of the semiconductor body are electrically connected to the conductor pattern.

3. A method as claimed in claim 1, wherein prior to the formation of the electrically conductive vias and prior to the provision of the semiconductor body on the flexible foil that is detachably secured to the substrate, the flexible foil is detachably secured, on the side of the insulating layer, to another substrate, after which the conductor pattern is formed in the conductive layer, whereafter the flexible foil is detachably secured, on the side of the conductor pattern, to the substrate, after which the other substrate is removed.

4. A method as claimed in claim 1, wherein prior to the provision of the semiconductor body on the flexible foil, a part thereof that is situated between the conductive vias in the insulating layer is provided with an electrically insulating fixing agent on which the semiconductor body is placed and the height of which determines the distance between the semiconductor body and the flexible foil.

5. A method as claimed in claim 1, wherein a solid photoresist material is used for the electrically insulating layer.

6. A method as claimed in claim 1, wherein for the material of the electrically insulating layer use is made of a polyimide, and for the material of the conductor pattern use is made of copper.

7. A semiconductor device which can suitably be used for surface mounting and which is obtained using a method as claimed in claim 1.

8. A method of manufacturing a semiconductor device which is suitable for surface mounting and which includes a semiconductor body comprising an active element provided with connection regions situated at the surface of the semiconductor body, an electrically insulating layer being provided, on one of its sides, with a conductor pattern which is suitable for surface mounting, and, on the other side, with the semiconductor body, the connection regions of the active element being connected to the conductor pattern by means of electrically conductive vias in the insulating layer, the method including the steps of:

forming the conductor pattern and the insulating layer on a flexible foil, wherein the flexible foil originally comprises a conductive layer and an electrically insulating layer;

detachably securing the flexible foil to a substrate on the side of the insulating layer; and detachably securing the flexible foil to a substrate on the side of the conductor pattern.

9. A method of manufacturing a semiconductor device which is suitable for surface mounting and which includes a semiconductor body comprising an active element provided with connection regions situated at the surface of the semiconductor body, an electrically insulating layer being provided, on one of its sides, with a conductor pattern which is suitable for surface mounting, and, on the other side, with the semiconductor body, the connection regions of the active element being connected to the conductor pattern by means of electrically conductive vias in the insulating layer, the method including the steps of:

forming the conductor pattern and the insulating layer on a flexible foil, wherein the flexible foil originally comprises a conductive layer and an electrically insulating layer;

detachably securing the flexible foil to a substrate on the side of the conductor pattern;

providing en electrically insulating fixing agent between the conductive vias in the insulating layer; and placing the semiconductor body on the electrically insulating fixing agent, wherein a height of the electrically insulating fixing agent determines a distance between the semiconductor body and the flexible foil.

* * * * *